US011444070B2

(12) United States Patent
Park et al.

(10) Patent No.: US 11,444,070 B2
(45) Date of Patent: Sep. 13, 2022

(54) SEMICONDUCTOR PACKAGES

(71) Applicant: SAMSUNG ELECTRONICS CO., LTD., Suwon-si (KR)

(72) Inventors: Yongjin Park, Asan-si (KR); Jiin Yu, Cheonan-si (KR); Jin-San Jung, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/200,984

(22) Filed: Mar. 15, 2021

(65) Prior Publication Data

US 2021/0343689 A1    Nov. 4, 2021

(30) Foreign Application Priority Data

May 4, 2020  (KR) ........................ 10-2020-0053215

(51) Int. Cl.
*H01L 25/18* (2006.01)
*H01L 23/00* (2006.01)
*H01L 23/48* (2006.01)

(52) U.S. Cl.
CPC ............ *H01L 25/18* (2013.01); *H01L 23/481* (2013.01); *H01L 24/32* (2013.01); *H01L 24/73* (2013.01); *H01L 24/83* (2013.01); *H01L 2224/32056* (2013.01); *H01L 2224/73204* (2013.01); *H01L 2224/83007* (2013.01)

(58) Field of Classification Search
CPC ........ H01L 25/18; H01L 23/481; H01L 24/32
See application file for complete search history.

(56) References Cited

U.S. PATENT DOCUMENTS

| 7,651,886 B2 | 1/2010 | Wang |
| 8,994,174 B2 | 3/2015 | Lee |
| 9,202,794 B2 | 12/2015 | Baek et al. |
| 9,252,111 B2 | 2/2016 | Lee |
| 9,548,434 B2 | 1/2017 | Margalit |
| 10,141,275 B2 | 11/2018 | Lin |
| 10,504,867 B2 | 12/2019 | Shimazaki |
| 2019/0295977 A1 | 9/2019 | Wu et al. |

*Primary Examiner* — Errol V Fernandes
(74) *Attorney, Agent, or Firm* — Volentine, Whitt & Francos, PLLC

(57) ABSTRACT

A semiconductor package may include a first semiconductor chip, a second semiconductor chip on the first semiconductor chip, and an adhesive layer between the first semiconductor chip and the second semiconductor chip. The first semiconductor chip may include a semiconductor substrate and a plurality of protection layers on the semiconductor substrate. The topmost layer of the protection layers may have a top surface with convex portions and concave portions, and the convex portions and the concave portions may be in contact with the adhesive layer.

20 Claims, 12 Drawing Sheets

SEMICONDUCTOR PACKAGES

CROSS-REFERENCE TO RELATED APPLICATIONS

A claim of priority under 35 U.S.C. § 119 is made to Korean Patent Application No. 10-2020-0053215, filed on May 4, 2020, in the Korean Intellectual Property Office, the entire disclosure of which is incorporated herein by reference.

BACKGROUND

The present disclosure relates to semiconductor packages and to methods of fabricating semiconductor packages.

Rapid advancements in electronic technologies coupled with increased operational requirements have resulted in a demand for electronic devices that are both smaller in dimensions and higher in functionality. In an effort to meet this demand, semiconductor packages have been proposed in which multiple semiconductor chips having through-vias are vertically stacked with an adhesive layer interposed therebetween.

SUMMARY

According to an embodiment of the disclosure, a semiconductor package may include a first semiconductor chip, a second semiconductor chip on the first semiconductor chip, and an adhesive layer between the first semiconductor chip and the second semiconductor chip. The first semiconductor chip may include a semiconductor substrate and first and second protection layers sequentially stacked on the semiconductor substrate. The first protection layer may be provided to define a plurality of holes, and the second protection layer may be in contact with the adhesive layer.

According to another embodiment of the disclosure, a semiconductor package may include a first semiconductor chip, a second semiconductor chip on the first semiconductor chip, and an adhesive layer between the first semiconductor chip and the second semiconductor chip. The first semiconductor chip may include a semiconductor substrate and a plurality of protection layers on the semiconductor substrate. The topmost layer of the protection layers may have a top surface with convex portions and concave portions, and the convex portions and the concave portions may be in contact with the adhesive layer.

According to yet another embodiment of the disclosure, a semiconductor package may include a first semiconductor chip, at least one second semiconductor chip stacked on the first semiconductor chip, and an adhesive layer between the first semiconductor chip and the second semiconductor chip. The first semiconductor chip may include a semiconductor substrate, a through-via penetrating the semiconductor substrate, first and second protection layers sequentially stacked on the semiconductor substrate, and an upper pad disposed on the second protection layer and connected to the through-via. The first protection layer may be provided to define a plurality of holes, and a level of a bottom surface of the second protection layer may be lower than a level of a top surface of the first protection layer, in a region overlapped with the holes.

According to still another embodiment of the disclosures, methods of fabricating the afore-described semiconductors packages are provided.

BRIEF DESCRIPTION OF THE DRAWINGS

Example embodiments will be more clearly understood from the detailed description that follows taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the disclosures will now be described more fully with reference to the accompanying drawings.

Figure 1:
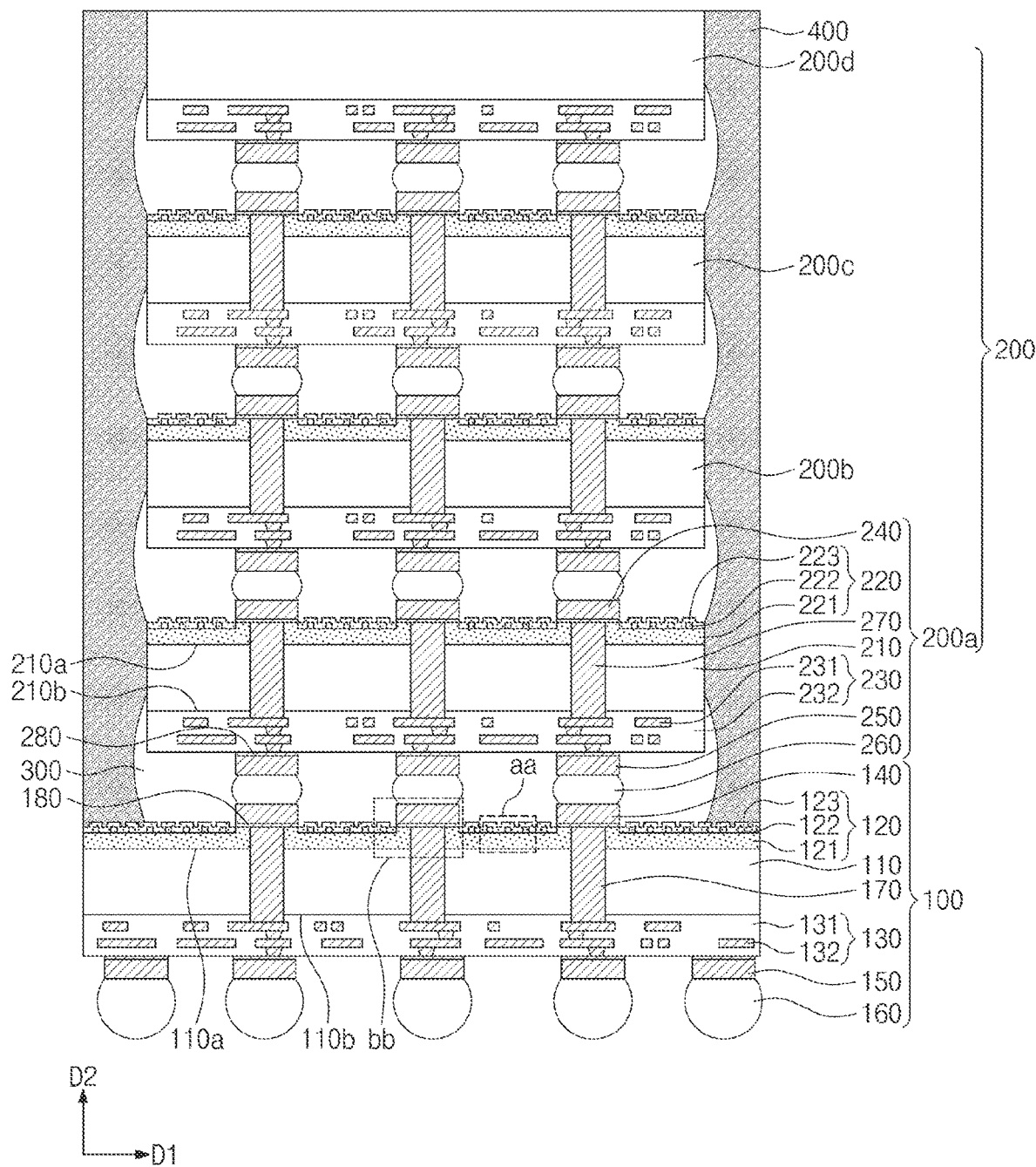
FIG. 1 is a sectional view illustrating a semiconductor package according to an embodiment of the disclosure.
Figure 2A:
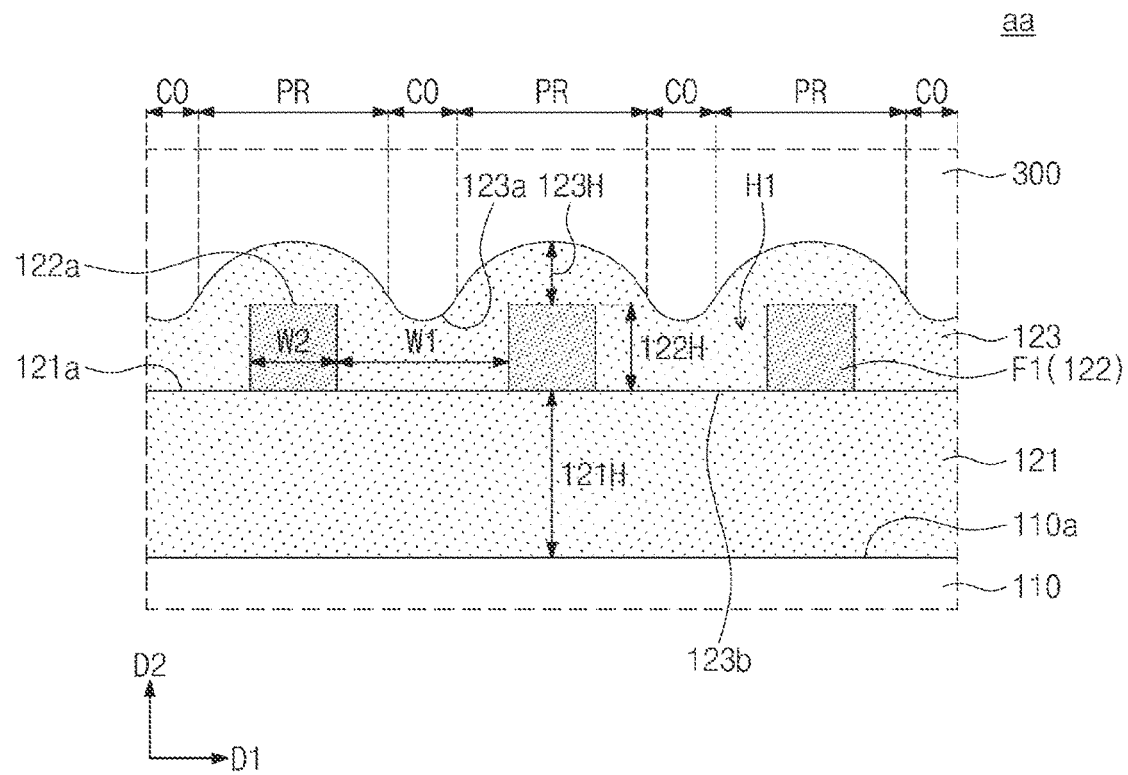
FIG. 2A is an enlarged sectional view illustrating a portion aa of the semiconductor package of FIG. 1 according to an embodiment of the disclosure.
Figure 2B:
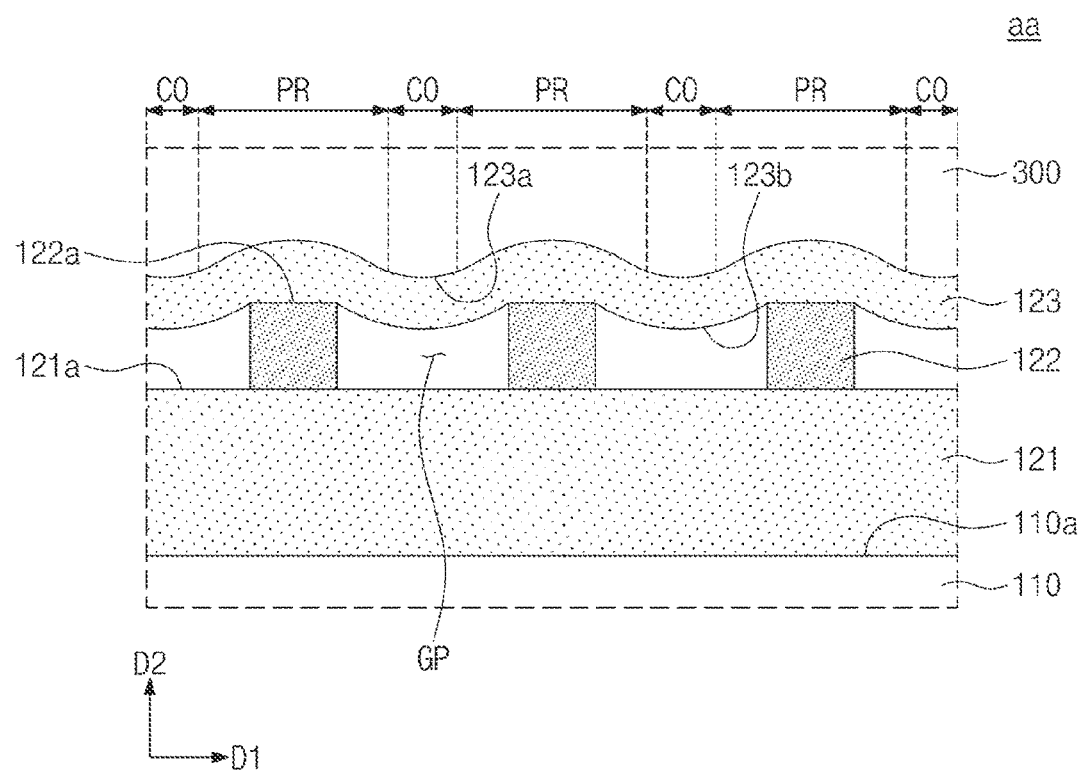
FIG. 2B is an enlarged sectional view illustrating the portion aa of the semiconductor package of FIG. 1 according to another embodiment of the disclosure.
Figure 3:
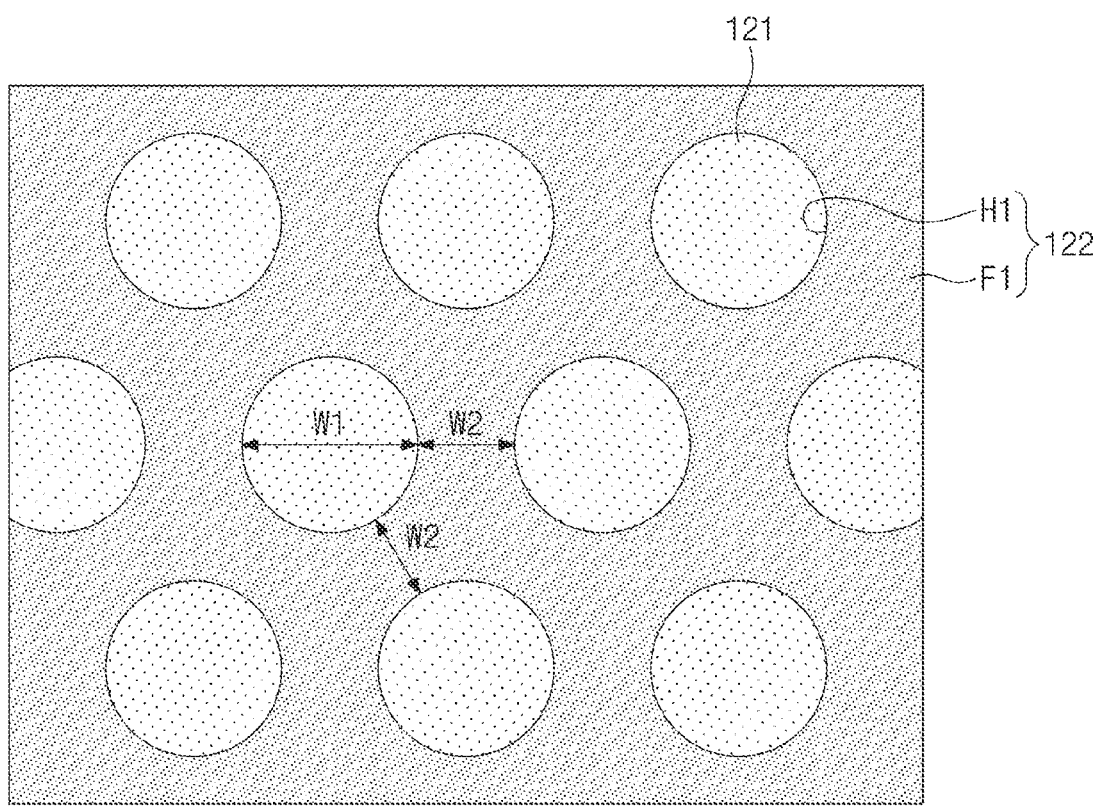
FIG. 3 is a top plan view schematically illustrating a protection layer of the semiconductor package of FIG. 1.
Figure 4:
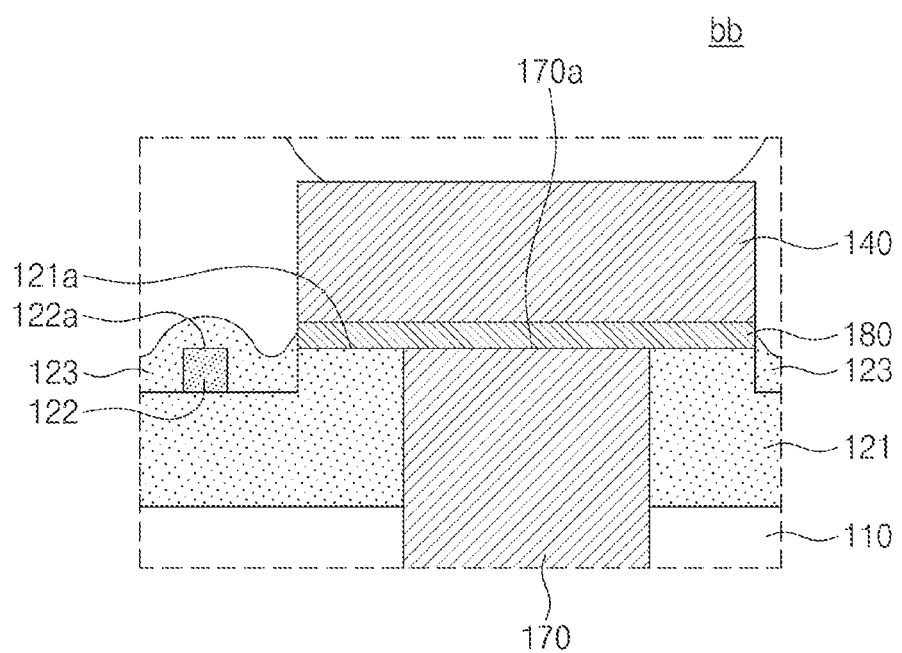
FIG. 4 is an enlarged sectional view illustrating a portion bb of the semiconductor package of FIG. 1 according to an embodiment of the disclosure.

FIG. 1 is a sectional view illustrating a semiconductor package according to an embodiment of the disclosure. FIG. 2A is an enlarged sectional view illustrating an example of a portion aa of the semiconductor package of FIG. 1. FIG. 2B is an enlarged sectional view illustrating another example of the portion aa of the semiconductor package of FIG. 1. FIG. 3 is a top plan view schematically illustrating a portion of a first protection stack of the semiconductor package of FIG. 1. FIG. 4 is an enlarged sectional view illustrating a portion bb of the semiconductor package of FIG. 1. For purposes of explanation and not limitation, the direction D1 shown in the drawings is referred to as a horizontal direction, and the direction D2 shown in the drawings is referred to as a vertical direction. Thus, terms like upper, lower, above and below are for descriptive purposes only and relate to the vertical direction D2 as oriented in the drawings.

Referring to FIG. 1, a semiconductor package 1000 may include a base chip 100, a chip stack 200, an adhesive layer 300, and a mold member 400.

The base chip 100 may be provided as the lowermost element of the semiconductor package 1000. In some embodiments such as that shown in FIG. 1, the base chip 100 may have a size in a horizontal plane that is larger than that of the semiconductor chips 200a to 200d of the chip stack 200 thereon. In other embodiments, the base chip 100 may be the same size in a horizontal plan as the semiconductor chips 200a to 200d.

The base chip 100 may include a first semiconductor substrate 110, a first through-via 170, a plurality of first upper pads 140, a plurality of first lower pads 150, first connection terminals 160, a first interconnection layer 130, and a first protection stack 120.

The first semiconductor substrate 110 may be formed of or include a semiconductor material (e.g., silicon (Si) or germanium (Ge)). In an embodiment, the first semiconductor substrate 110 may be formed of or include a compound semiconductor material (e.g., silicon carbide (SiC), gallium arsenide (GaAs), indium arsenide (InAs), or indium phosphide (InP)). The first semiconductor substrate 110 may have a silicon-on-insulator (SOI) structure. For example, the first semiconductor substrate 110 may include a buried oxide (BOX) layer. The first semiconductor substrate 110 may include a conductive region (e.g., a doped well or a structure doped with impurities). The first semiconductor substrate 110 may be provided to include at least one of various device isolation structures (e.g., a shallow trench isolation (STI) structure).

The first semiconductor substrate 110 may include a first surface 110a and a second surface 110b, which are opposite to each other. The first semiconductor substrate 110 may include a first circuit layer, which is provided on the second surface 110b of the first semiconductor substrate 110. The first circuit layer may include various elements, and the kinds of the elements in the first circuit layer may be changed depending on the kind of the base chip 100. As an example, the first circuit layer may include a plurality of logic devices. In this case, the base chip 100 may be used as a logic chip. The base chip 100 may be provided as the lower element of the chip stack 200 to deliver signals from the semiconductor chips 200a to 200d to the outside and to deliver signals and electric power from the outside to the semiconductor chips 200a to 200d. Accordingly, the base chip 100 may be referred to as a buffer chip or a control chip.

The first interconnection layer 130 may be provided on the second surface 110b of the first semiconductor substrate 110. The first interconnection layer 130 may include a first insulating layer 131 and a first interconnection structure 132 interposed therebetween. The first interconnection structure 132 may include, for example, interconnection lines and/or contacts. The first interconnection structure 132 may be used to connect the elements or conductive region of the first circuit layer and/or the first semiconductor substrate 110 to the first connection terminals 160.

The first protection stack 120 may be provided on the first surface 110a of the first semiconductor substrate 110. The first protection stack 120 may include a first protection layer 121, a second protection layer 122, and a third protection layer 123, which are sequentially stacked on the first semiconductor substrate 110. The first protection stack 120 will be described in more detail below.

The first through-via 170 may be provided to penetrate the first semiconductor substrate 110. In addition, the first through-via 170 may be extended into the first protection stack 120 and the first interconnection layer 130. The first through-via 170 may be a pillar-shaped pattern and may include a conductive pattern and a barrier layer covering at least an outer side surface of the conductive pattern. The barrier layer may be formed of or include at least one of Ti, TiN, Ta, TaN, Ru, Co, Mn, WN, Ni, or NiB. The conductive pattern may be formed of or include at least one of Cu, Cu alloys (e.g., CuSn, CuMg, CuNi, CuZn, CuPd, CuAu, CuRe, and CuW), W, W alloys, Ni, Ru, or Co. A via insulating layer may be interposed between the first through-via 170 and the first semiconductor substrate 110 or between the first through-via 170 and the first interconnection layer 130.

As shown in FIGS. 1 and 4, the first through-via 170 may be horizontally spaced apart from the second protection layer 122. The first through-via 170 may not penetrate the second protection layer 122 and the third protection layer 123.

As shown in FIGS. 1 and 4, the first upper pads 140, which are electrically connected to the first through-vias 170, may be provided on the first protection stack 120. Each of the first upper pads 140 may include a seed pattern 180, which is in contact with a portion of the first protection layer 121. The first upper pads 140 may be vertically overlapped with the first protection layer 121 but not with the second protection layer 122 and the third protection layer 123.

The first lower pads 150, which are electrically connected to the first through-vias 170, may be provided on the first interconnection layer 130. Seed patterns 180 may also be provided on the lower pads 150, respectively, and connected to the first interconnection layer 130.

The first upper pad 140, the first lower pad 150, and the seed patterns 180 may be formed of or include a metallic material, such as copper (Cu), aluminum (Al), and/or nickel (Ni).

The first connection terminals 160 may be provided on the first lower pad 150. The first connection terminal 160 may be formed of or include an alloy containing at least one of tin (Sn), silver (Ag), copper (Cu), nickel (Ni), bismuth (Bi), indium (In), antimony (Sb), or cerium (Ce).

Hereinafter, the first protection stack 120 will be described in more detail. The first protection layer 121 may be formed of or include an insulating material (e.g., silicon oxide ($SiO_2$)). At least a portion of the first protection layer 121 may be vertically overlapped with the first upper pad 140.

Referring to FIGS. 2A and 3, the second protection layer 122 may be provided on the first protection layer 121. The second protection layer 122 may be formed of or include a material different from the first protection layer 121. As an example, the second protection layer 122 may be formed of or include silicon nitride (SiN). The second protection layer 122 may include a frame F1, which is defined by a plurality of holes H1. The frame F1 may have a mesh shape, when viewed in a plan view.

Each of the holes H1 may have a circular shape or a shape resembling a circle, when viewed in a plan view. However, the shape of the holes H1 is not limited thereto and may be variously changed (e.g., to a rectangular shape). The holes H1 may be provided to partially expose a top surface of the first protection layer 121.

Each of the holes H1 may have a diameter W1, when measured in a first direction D1 parallel to a top surface of the first semiconductor substrate 110. The diameter W1 may range from 1 µm to 2 µm, and each of the holes H1 may have a depth 122H ranging from 0.25 µm to 2 µm. The depth 122H of each of the holes H1 may correspond to a thickness 122H of the second protection layer 122.

A distance W2 between adjacent ones of the holes H1 may be equal to a width W2 of the frame F1 in the first direction D1. The width W2 of the frame F1 may range from 1 µm to 2 µm. The diameter W1 of the holes H1 may be larger than the width W2 of the frame F1 and the depth 122H of the holes H1. The width W2 of the frame F1 and the depth 122H of the holes H1 may be ½ to 1 times the diameter W1.

The third protection layer 123 may be provided on the second protection layer 122. The third protection layer 123 may be formed of or include a material different from the second protection layer 122. The third protection layer 123 may be formed of or include the same material as the first protection layer 121. As an example, the third protection layer 123 may be formed of or include silicon oxide ($SiO_2$).

The third protection layer 123 may be provided to fill at least a portion of the hole H1 in the second protection layer 122. Portions of a top surface 123a of the third protection layer 123 overlapped with the holes H1 may be located at a level lower than portions of the top surface 123a overlapped with the frame F1.

In the regions overlapped with the holes H1, a level of a bottom surface 123b of the third protection layer 123 may be lower than a level of a top surface 122a of the second protection layer 122. The bottom surface 123b of the third protection layer 123 may be in contact with the exposed portions of the top surface of the first protection layer 121. In an embodiment, the portions of the top surface 123a of the third protection layer 123 overlapped with the holes H1 may be located at a level lower than the top surface 122a of the second protection layer 122.

A direction normal to the first surface 110a of the first semiconductor substrate 110 may be defined as a second direction D2. The first protection layer 121, the second protection layer 122, and the third protection layer 123 may have thicknesses 121H, 122H, and 123H, respectively, when measured in the second direction D2.

The thickness 121H of the first protection layer 121 may be larger than the thickness 122H of the second protection layer 122 and the thickness 123H of the third protection layer 123. As an example, the thickness 121H of the first protection layer 121 may be about three times the thickness 122H of the second protection layer 122 or the thickness 123H of the third protection layer 123. In an embodiment, the thickness 122H of the second protection layer 122 may be substantially equal to the thickness 123H of the third protection layer 123.

Referring to FIGS. 1 and 4, a top surface 121a of the first protection layer 121 may include a portion that is vertically overlapped with the first upper pad 140 and is coplanar with a top surface 170a of the first through-via 170. In addition, the top surface 122a of the frame F1 of the second protection layer 122 may be located at substantially the same level as the top surface 170a of the first through-via 170.

Alternatively, in an embodiment, the level of the top surface 123a of the third protection layer 123, which is vertically overlapped with the holes H1, may be higher than the level of the top surface 122a of the second protection layer 122, as shown in FIG. 2B. In an embodiment, the bottom surface 123b of the third protection layer 123 may be vertically spaced apart from the top surface 121a of the first protection layer 121. An empty space GP may be formed between the third protection layer 123 and the first protection layer 121.

The third protection layer 123 may include convex portions PR and concave portions CO, which are alternately repeated on the top surface 123a. The convex portions PR may be vertically overlapped with the frame F1, and the concave portions CO may be vertically overlapped with the holes H1.

As shown in FIG. 1, the chip stack 200 may be stacked on the base chip 100 and may include at least one semiconductor chip. In the semiconductor package 1000 according to the present embodiment, the chip stack 200 may include four semiconductor chips (e.g., first to fourth semiconductor chips 200a-200d). However, the disclosure is not limited to the specific number of the semiconductor chips constituting the chip stack 200, and in an embodiment the chip stack 200 may be configured to include 1 to 32 semiconductor chips.

Each of the semiconductor chips 200a to 200d of the chip stack 200 may have a structure similar to the base chip 100. As an example, the first semiconductor chip 200a may include a second semiconductor substrate 210, a second through-via 270, a second upper pad 240, a second lower pad 250, a second connection terminal 260, a second interconnection layer 230 and a second protection stack 220. Here, the second semiconductor substrate 210 may include a first surface 210a and a second surface 210b, which are opposite to each other. The second semiconductor substrate 210 may include a second circuit layer integrated on the second surface 210b. For example, the second circuit layer may include a plurality of memory devices. For example, the second circuit layer may include at least one of volatile memory devices (e.g., DRAM and SRAM devices) or non-volatile memory devices (e.g., PRAM, MRAM, FeRAM, and RRAM devices). In the semiconductor package 1000 according to the present embodiment, the semiconductor chips 200a to 200d may be high bandwidth memory dynamic random-access memory (HBM DRAM) chips, in which a device layer including DRAM devices is provided. In this case, the semiconductor package 1000 according to the present embodiment may be a HBM package. Except for the afore-described features, the second through-via 270, the second upper pad 240, the second lower pad 250, the second connection terminal 260, and the second protection stack 220 may be configured to have substantially the same or corresponding features as the first through-via 170, the first upper pad 140, the first lower pad 150, the first connection terminal 160, and the first protection stack 120 of the base chip 100.

The second interconnection layer 230 may include a second insulating layer 231 and a second interconnection structure 232 interposed therebetween. The second protection stack 220 may include third protection layer 221, a fourth protection layer 222, and a fifth protection layer 223. The third protection layer 221, the fourth protection layer 222, and the fifth protection layer 223 may be configured to have substantially the same or corresponding the first protection layer 121, the second protection layer 122, and the third protection layer 123.

The adhesive layer 300 may be interposed between the base chip 100 and the first semiconductor chip 200a and between two adjacent ones of the semiconductor chips and may be provided to enclose a side surface of the second connection terminal 260. The adhesive layer 300 may protrude from side surfaces of the semiconductor chips 200a to 200d in an outward direction, as shown in FIG. 1. The adhesive layer 300 may be formed of, for example, a non-conductive film (NCF). As shown in FIGS. 1 and 2A, the adhesive layer 300 may be in contact with the third protection layer 123 of the first protection stack 120. The convex and concave portions PR and CO of the third protection layer 123 may be in contact with the adhesive layer 300, and in this case, a contact area between the third protection layer 123 and the adhesive layer 300 may be increased, compared with the case in which the third protection layer 123 has a flat top surface. In addition, a surface area of the top surface 123a of the third protection layer 123 may be greater than a surface area of the top surface 121a of the first protection layer 121.

The NCF may be used as an adhesive layer when semiconductor chips are bonded in a thermal compression bonding (TCB) manner during a process of stacking semiconductor chips. According to an embodiment of the disclosure, since the first and second protection stacks 120 and 220 are provided to have concavo-convex top surfaces, contact areas between the first and second protection stacks 120 and 220 and the adhesive layer 300 (e.g., the NCF) may be increased.

As an example, in the case where, in the example of FIGS. 2A and 2B, the width W2, the depth 122H, and the diameter W1 are given by a ratio of 1:0.5 to 1:2, a contact area between the third protection layer 123 and the adhesive layer 300 may be increased by 30.2%, compared with the third protection layer 123 of a flat top surface.

The molding member 400 may be provided to cover at least a portion of the top surface of the base chip 100, a side surface of the chip stack 200, and a side surface of the adhesive layer 300. In an embodiment, the molding member 400 may not cover a top surface of the fourth semiconductor chip 200d. In another embodiment, the molding member 400 may cover the top surface of the fourth semiconductor chip 200d. The molding member 400 may be formed of or include, for example, an epoxy molding compound (EMC).

FIGS. 5 to 17 are sectional views illustrating a method of fabricating a semiconductor package, according to an embodiment of the disclosure. An element previously described with reference to FIG. 1 will be identified by the same reference number without repeating an overlapping description thereof, for the sake of brevity.

Figure 5:
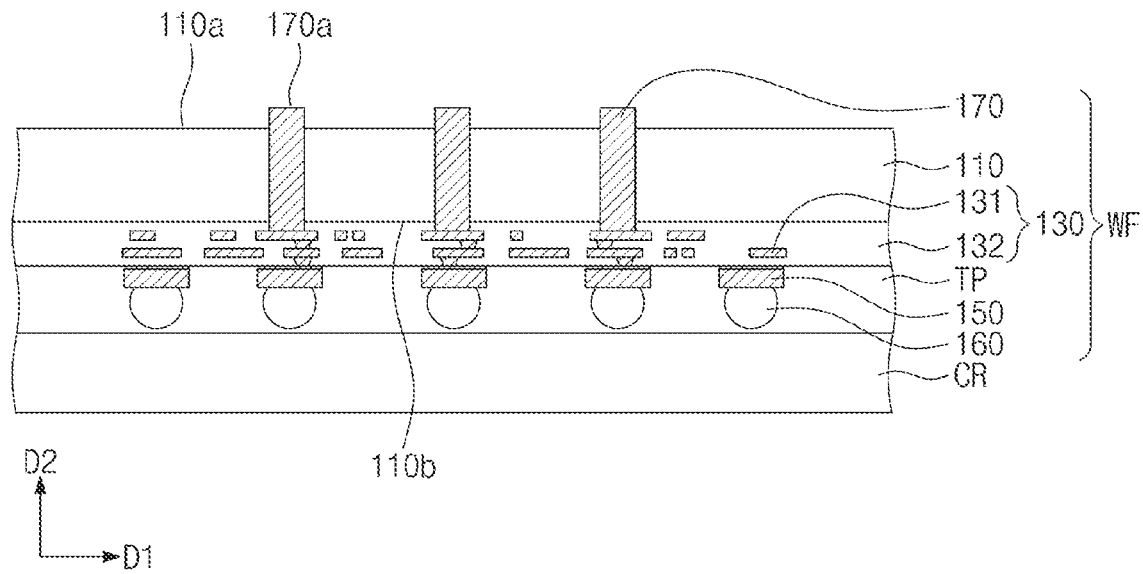
FIGS. 5 to 17 are sectional views for reference in describing a method of fabricating a semiconductor package according to an embodiment of the disclosure.

Referring to FIG. 5, a wafer WF may be provided. The wafer WF may be attached to a carrier substrate CR using tape TP. The base chip 100 of FIG. 1 may be formed by performing additional processes (for example, including a cutting process) on the wafer WF.

The wafer WF may include the first semiconductor substrate 110, the first through-vias 170, the first interconnection layer 130, the first lower pads 150, and the first connection terminals 160. The first through-vias 170 may be formed to penetrate the first semiconductor substrate 110, and in this case, the top surface 170a of the first through-via 170 may be higher than the first surface 110a of the first semiconductor substrate 110. The first interconnection layer 130 may be formed on the second surface 110b of the first semiconductor substrate 110.

Figure 6:
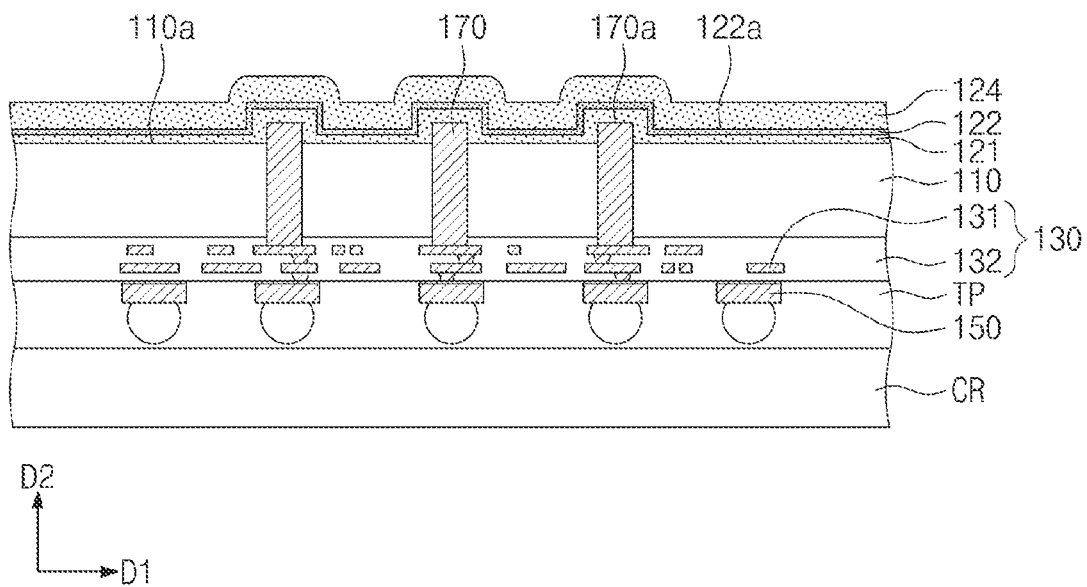

Referring to FIG. 6, a plurality of protection layers 121 and 122 and a sacrificial layer 124 may be formed on the first surface 110a of the first semiconductor substrate 110. The protection layers 121 and 122 and the sacrificial layer 124 may be formed by a chemical vapor deposition (CVD), an atomic layer deposition (ALD), or a spin-coating method. The protection layers 121 and 122 may include the first protection layer 121 and the second protection layer 122, which are sequentially stacked. In an embodiment, the first protection layer 121 may be formed of or include silicon oxide, the second protection layer 122 may be formed of or include silicon nitride, and the sacrificial layer 124 may be formed of or include silicon oxide. The sacrificial layer 124 may be thicker than the first protection layer 121 and the second protection layer 122. The first protection layer 121 may be thicker than the second protection layer 122. The first protection layer 121 may be formed to conformally cover the first surface 110a of the first semiconductor substrate 110 and portions of the first through-vias 170 protruding above the first surface 110a of the first semiconductor substrate 110. The second protection layer 122 and the sacrificial layer 124 may have shapes that are offset from the first protection layer 121. The top surface 122a of the second protection layer 122, which is not overlapped with the first through-via 170, may be lower than the top surface 170a of the first through-via 170.

Figure 7:
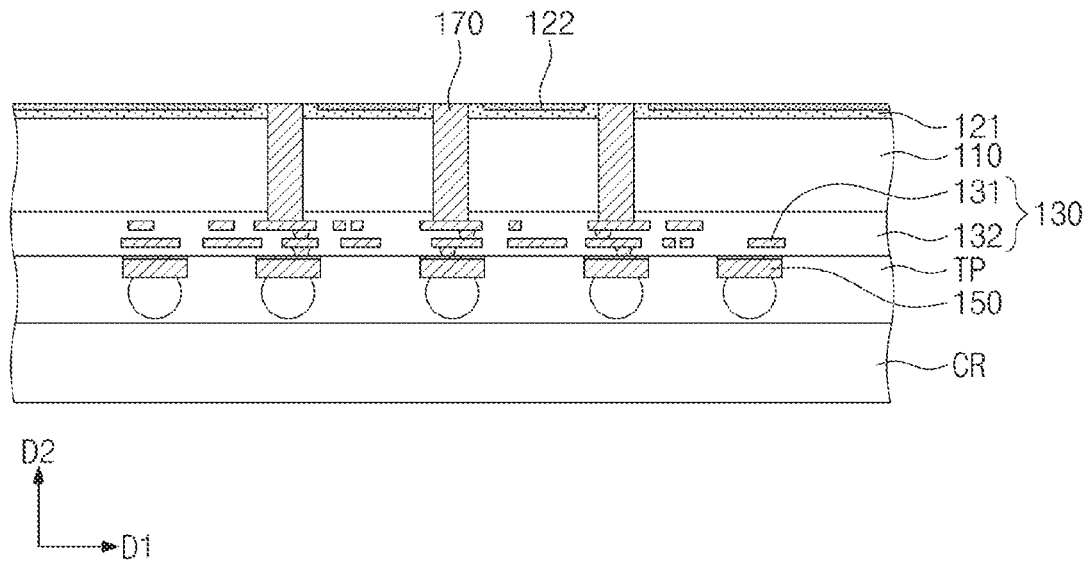

Referring to FIG. 7, a planarization process may be performed on the first through-via 170, the first protection layer 121, and the second protection layer 122. The planarization process may be, for example, a chemical-mechanical polishing (CMP) process. The planarization process may be performed to expose a top surface of the second protection layer 122 in a region that is not vertically overlapped with the first through-via 170. As a result of the planarization process, the sacrificial layer 124 may be removed, and the top surface of the second protection layer 122 may be exposed. A top surface of the first protection layer 121 adjacent to the first through-via 170 may be partially exposed to the outside. The top surface of the first through-via 170, a portion of the top surface of the first protection layer 121, and the top surface of the second protection layer 122 may be coplanar with each other.

Figure 8:
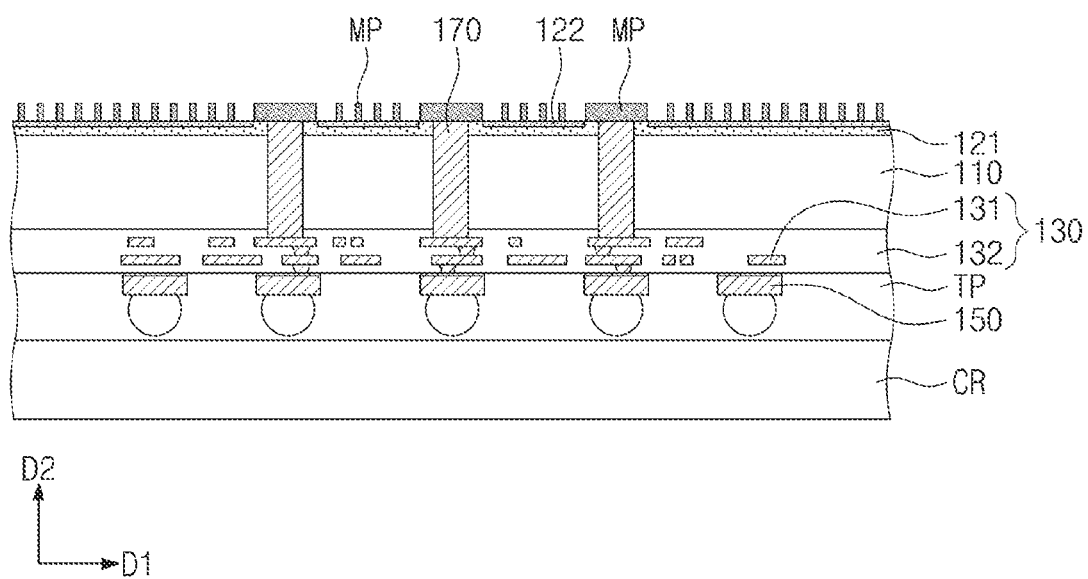

Referring to FIG. 8, a mask pattern MP may be formed on the second protection layer 122. The mask pattern MP may be formed by forming, exposing, and developing a photoresist layer. The mask pattern MP may be formed to have openings exposing the top surface of the second protection layer 122.

Figure 9:
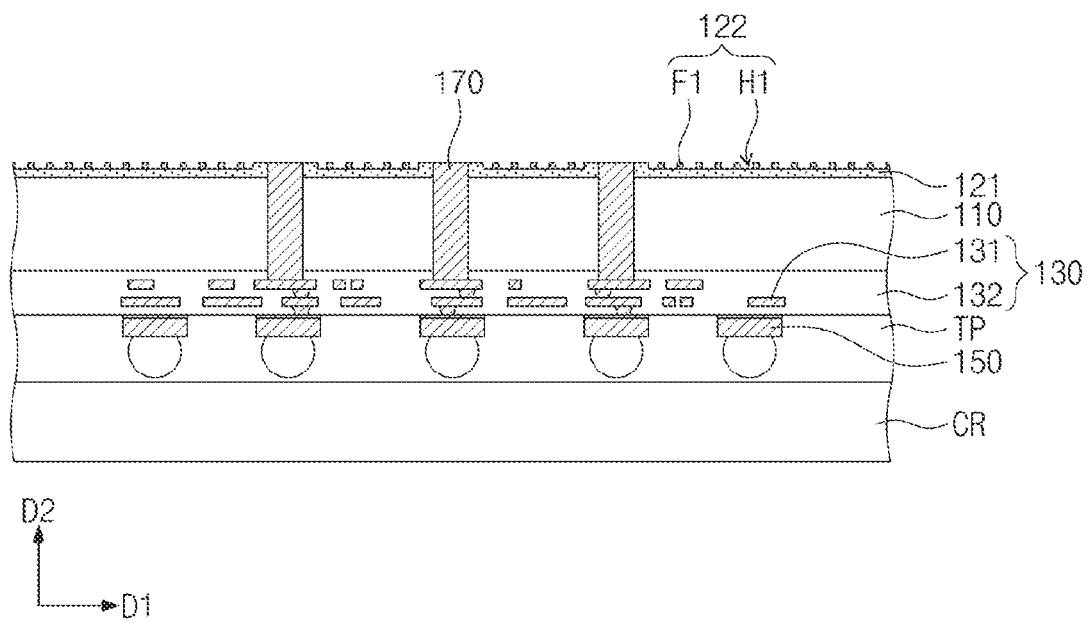

Referring to FIG. 9, an etching process may be performed on the second protection layer 122 using the mask pattern MP of FIG. 8 as an etch mask. The etching process may include an anisotropic etching process, such as a plasma etching process.

As a result of the etching process, the holes H1 shown in FIG. 3 may be formed to penetrate the second protection layer 122. The second protection layer 122 may be formed to include the holes H1 and the frame F1 defined by the holes H1. The frame F1 may have a mesh shape, when viewed in a plan view.

Figure 10:
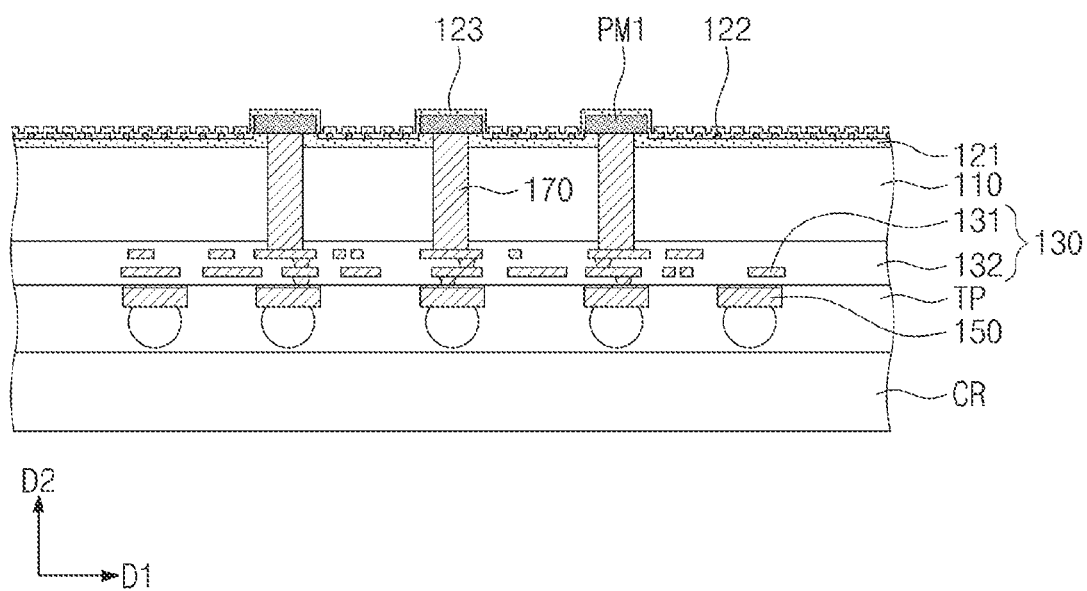

Referring to FIG. 10, a first photoresist pattern PM1 may be formed on a top surface of the first through-via 170. The first photoresist pattern PM1 may define a region, on which the first upper pad 140 of FIG. 1 will be formed. The first photoresist pattern PM1 may be formed by forming, exposing, and developing a photoresist layer. Thereafter, the third protection layer 123 may be formed on the second protection layer 122, the mask pattern, and the first photoresist pattern PM1. The third protection layer 123 may include a material different from the second protection layer 122 and may include the same material as the first protection layer 121. As an example, the third protection layer 123 may be formed of or include silicon oxide. The third protection layer 123 may be in contact with the first protection layer 121, near the first through-via 170. There may be no observable interface between the first protection layer 121 and the third protection layer 123, which are in contact with each other.

Figure 11:
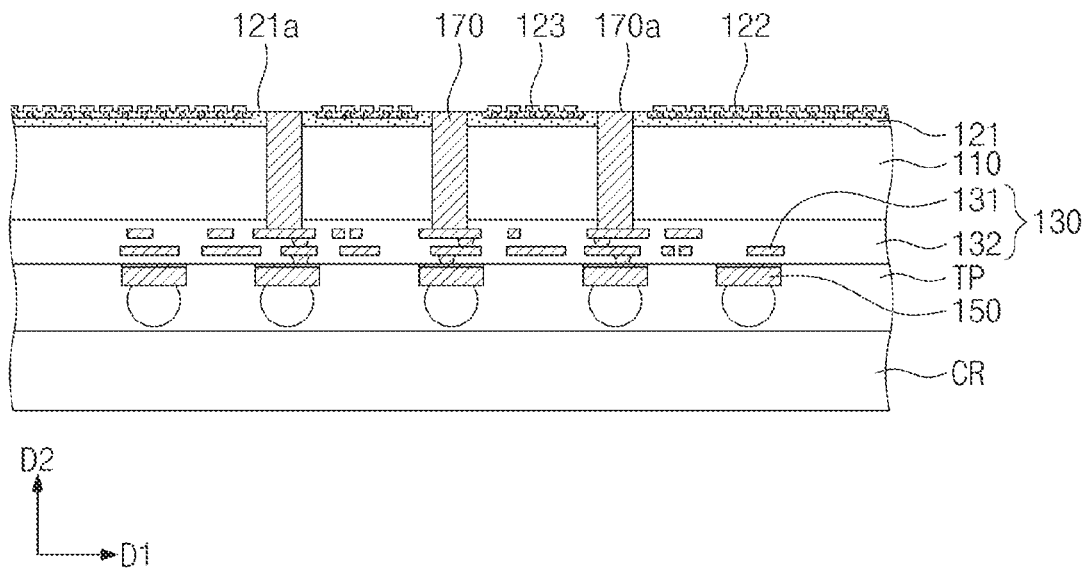

Referring to FIG. 11, the first photoresist pattern PM1 and the third protection layer 123 on the first photoresist pattern PM1 may be removed. The removal process may be, for example, a lift-off process. As a result of the removal of the first photoresist pattern PM1, the top surface 170a of the first through-via 170 and the portion 121a of the top surface of the first protection layer 121 may be exposed to the outside.

Figure 12:
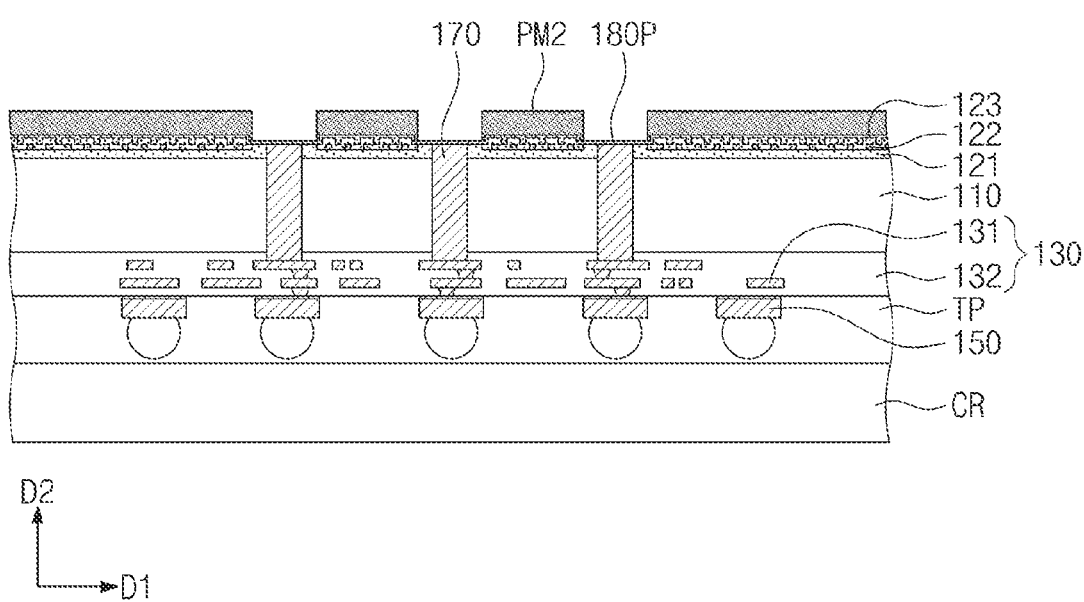

Referring to FIG. 12, a seed layer 180P may be formed on the exposed portions of the first protection layer 121, the third protection layer 123, and the first through-via 170. The seed layer 180P may be conformally formed by, for example, an atomic layer deposition (ALD). A second photoresist pattern PM2 may be formed on the seed layer 180P. The second photoresist pattern PM2 may be formed to expose a region on which the first upper pad 140 of FIG. 1 will be formed. The second photoresist pattern PM2 may be formed by forming, exposing, and developing a photoresist layer.

Figure 13:
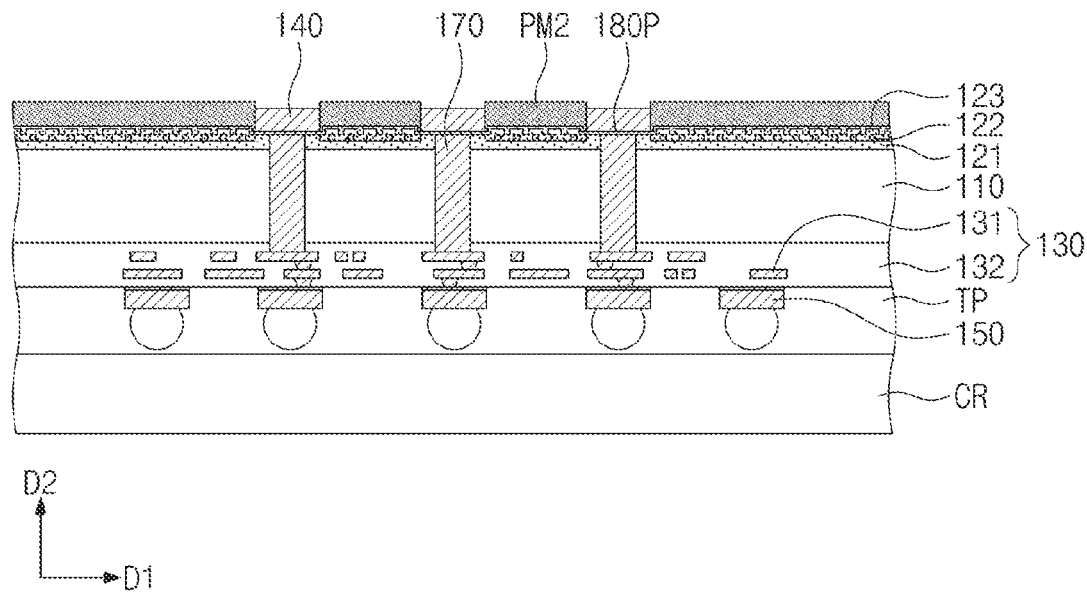
Figure 14:
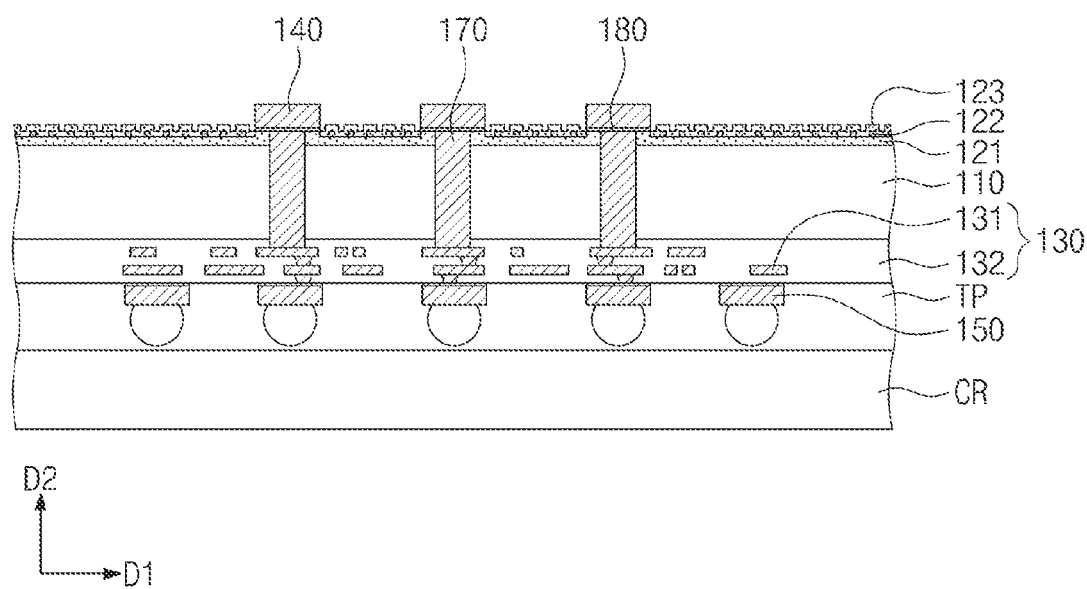

Referring to FIGS. 13 and 14, the first upper pad 140 may be formed by, for example, an electroplating method using the seed layer 180P as a seed layer. Thereafter, the second photoresist pattern PM2 may be removed, and the seed pattern 180 may be formed. The removal process may be, for example, a lift-off process.

Figure 15:
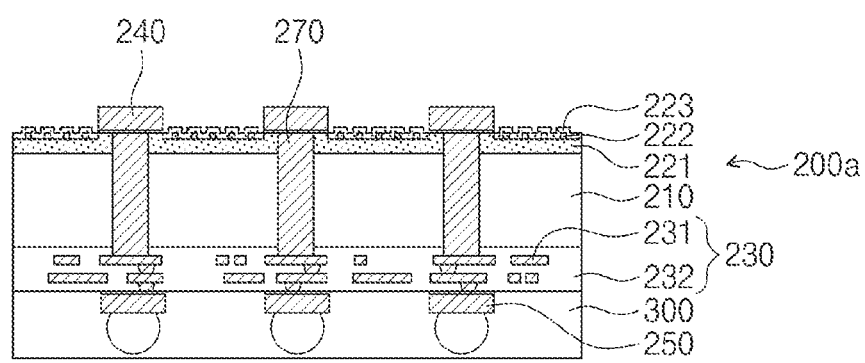
Figure 15:
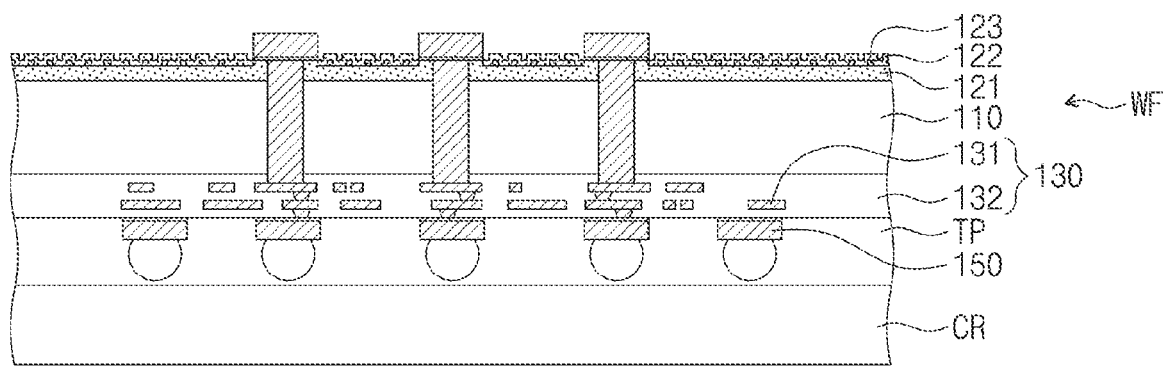

Referring to FIG. 15, the first semiconductor chip 200a may be mounted on the first semiconductor substrate 110. The first semiconductor chip 200a may include the second semiconductor substrate 210, the second protection stack 220, the second through-via 270, the second upper pad 240, the second lower pad 250, the second interconnection layer 230, and a second connection terminal 280, as described with reference to FIG. 1. The second protection stack 220 of the first semiconductor chip 200a may be formed in substantially the same manner as that described with reference to FIGS. 5 to 14. The adhesive layer 300 (e.g., FIG. 1) may be attached to the top surfaces of the second connection terminal 260 and the second interconnection layer 230. The second connection terminal 260 and the first upper pad 140 may be aligned to each other during the mounting process and such an alignment may be maintained throughout the mounting process.

Figure 16:
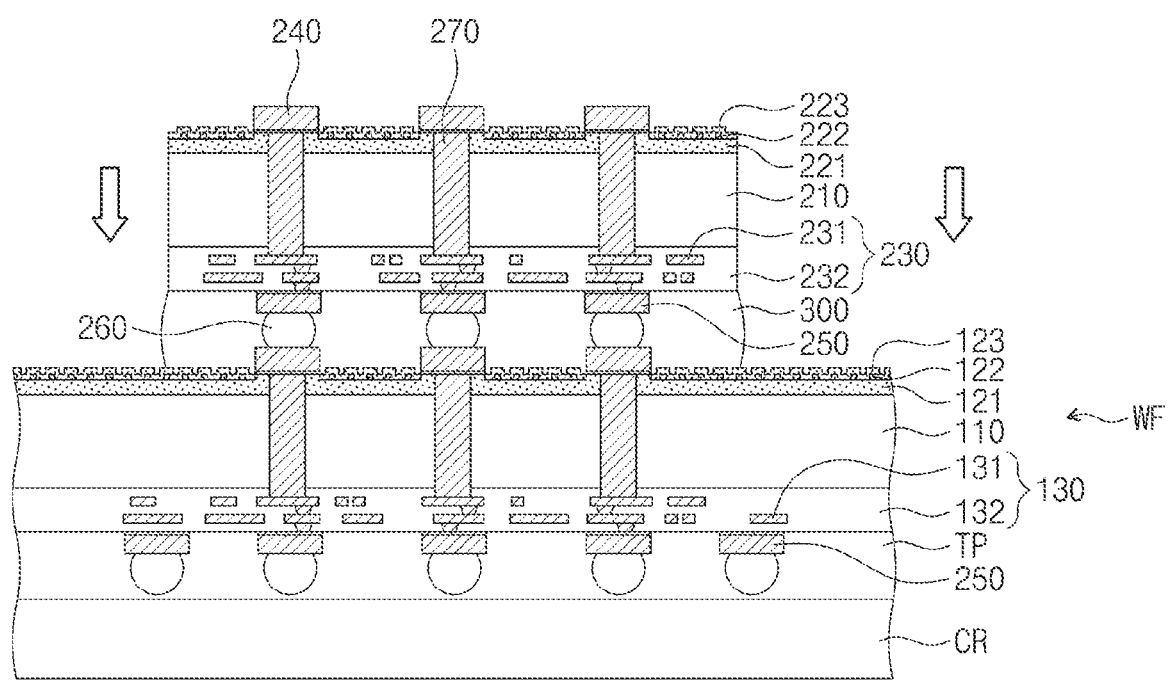

Referring to FIG. 16, a first thermal compression process may be performed on the wafer WF and the first semiconductor chip 200a. During the first thermal compression process, a first pressure may be exerted on the first semiconductor chip 200a and a process temperature may be maintained at a first temperature. In an embodiment, the first temperature may be about 100° C. During the first thermal compression process, the adhesive layer 300 may be in contact with the third protection layer 123 while being maintained in an uncured state. In particular, the convex and concave portions PR and CO of the third protection layer 123 may be in contact with the adhesive layer 300, as described with reference to FIGS. 2A and 2B. In this case, a contact area between of the third protection layer 123 and the adhesive layer 300 may be increased, compared with the case that third protection layer 123 has a flat top surface. The first thermal compression process may be performed to allow the adhesive layer 300 to be in strong or effective contact with the third protection layer 123.

Figure 17:
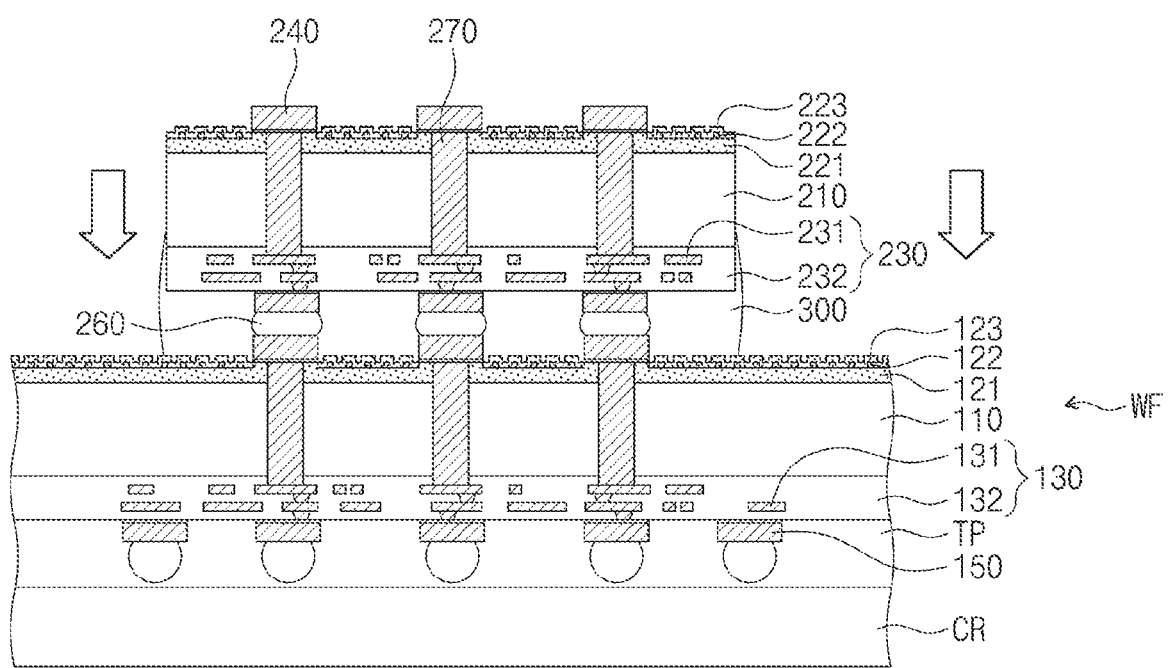

Referring to FIG. 17, a second thermal compression process may be performed on the wafer WF and the first semiconductor chip 200a. During the second thermal compression process, a second pressure may be exerted on the first semiconductor chip 200a and a process temperature may be maintained at a second temperature. The second pressure may be higher than the first pressure described with reference to FIG. 16. Accordingly, a portion of the adhesive layer 300 may protrude laterally from side surfaces of the interconnection layer 230 of the first semiconductor chip 200a and the first semiconductor substrate 110. In addition, the second connection terminal 260 may be thinned. The second temperature may be higher than the first temperature described with reference to FIG. 16. For example, the second temperature may be about 300° C. As a result of second thermal compression process performed at the second temperature, the adhesive layer 300 may be cured and may not have fluidity any more.

According to a conventional fabrication process, the first thermal compression process is performed at a sufficiently high temperature so as to allow the adhesive layer 300 to have a sufficiently strong adhesion strength and a sufficiently long process time is required to realize good adhesion characteristics. If the process temperature of the first thermal compression process is increased to reduce the process time, the adhesive layer 300 may be cured and the cured adhesive layer 300 may be interposed between the second connection terminal 260 of the first semiconductor chip 200a and the first upper pad 140 of the wafer WF. In this case, the second connection terminal 260 may not be normally (e.g., well) attached to the first upper pad 140. By contrast, if the process time is reduced and the process temperature is maintained to a low temperature, because the first semiconductor chip 200a is not normally (e.g., well) attached to the wafer WF, the curing process may be finished even when the attaching process is not yet performed in the second thermal compression process. In this case, the first semiconductor chip 200a may be easily detached from the wafer WF.

According to an embodiment of the disclosure, the first protection stack 120 in contact with the adhesive layer 300 may be provided to have an increased surface area, and thus, a contact area between the adhesive layer 300 and the first protection stack 120 may be increased. Accordingly, even when the process temperature is not controlled at a high temperature, it may be possible to reduce the process time of the first thermal compression process. Furthermore, due to the increase in the contact area, the adhesion strength may be increased.

Referring back to FIG. 1, second to fourth semiconductor chips 200b to 200d attached with the adhesive layer 300 may be sequentially mounted on the first semiconductor chip 200a to form the chip stack 200. During this process, the first and second thermal compression processes may be performed on each of the second to fourth semiconductor chips 200b to 200d in the same or similar manner as that described above.

Since each of the first to third semiconductor chips 200a to 200c includes the fifth protection layer 223 with a concavo-convex top surface, it may be possible to reduce a process time in the attaching process of the adhesive layer 300 and to improve the attaching reliability.

The molding member 400 may be formed to cover the wafer WF and the chip stack 200. A singulation process may be performed on the molding member 400 and the wafer WF to form the semiconductor package 1000. The base chip 100 may be formed by the singulation process on the wafer WF. Thereafter, the carrier substrate CR and the tape TP may be removed.

According to an embodiment of the disclosure, a lower chip may include a protection layer having a concavo-convex surface and consequently an increased surface area. Thus, a contact area between the protection layer and an adhesive layer can be increased, and this may allow for a better adhesion property therebetween. As a result, it may be possible to improve reliability and production efficiency of a semiconductor package.

While example embodiments of the disclosure have been particularly shown and described, it will be understood by one of ordinary skill in the art that variations in form and detail may be made therein without departing from the spirit and scope of the attached claims.

What is claimed is:
1. A semiconductor package comprising:
 a first semiconductor chip adhered to a second semiconductor chip by an adhesive layer between the first semiconductor chip and the second semiconductor chip, wherein:
 the first semiconductor chip comprises:
  a semiconductor substrate; and a first protection layer and a second protection layer sequentially stacked on the semiconductor substrate, the first protection layer includes a plurality of holes defined therein, and the second protection layer is in contact with the adhesive layer.

2. The semiconductor package of claim 1, wherein the second protection layer fills a portion of the holes defined in the first protection layer.

3. The semiconductor package of claim 1, wherein each of the plurality of holes has a depth in a vertical direction orthogonal to an upper surface of the first protection layer, and a diameter in a horizontal direction parallel the upper surface of the first protection layer, where the depth is ½ to 1 times the diameter.

4. The semiconductor package of claim 1, wherein:

the first protection layer has a mesh shaped configuration, the first protection layer comprises a frame defined by the holes, and a width of the frame is ½ to 1 times a diameter of the holes, when measured in a first direction.

5. The semiconductor package of claim 1, wherein:

the first semiconductor chip further comprises a third protection layer, and the third protection layer is interposed between the semiconductor substrate and the first protection layer.

6. The semiconductor package of claim 5, wherein the third protection layer comprises a material that is different from that of the first protection layer and is the same as that of the second protection layer.

7. The semiconductor package of claim 5, wherein a thickness of the third protection layer is greater than a thickness of the first protection layer or a thickness of the second protection layer.

8. The semiconductor package of claim 5, wherein a part of a top surface of the third protection layer is exposed by the holes, and a bottom surface of the second protection layer contacts part of the top surface of the exposed third protection layer.

9. The semiconductor package of claim 5, wherein the first semiconductor chip further comprises a through-via penetrating the semiconductor substrate, the through-via extending vertically into the third protection layer and horizontally spaced apart from the second protection layer.

10. The semiconductor package of claim 9, wherein the level of the top surface of the first protection layer is substantially the same as the level of the top surface of the through-via.

11. A semiconductor package comprising:

a first semiconductor chip;

a second semiconductor chip on the first semiconductor chip; and an adhesive layer between the first semiconductor chip and the second semiconductor chip, wherein:

the first semiconductor chip comprises:

a semiconductor substrate; and a plurality of protection layers on the semiconductor substrate, a topmost layer among the protection layers has a top surface with convex portions and concave portions, and the convex portions and the concave portions are in contact with the adhesive layer.

12. The semiconductor package of claim 11, wherein:

the protection layers comprise a first protection layer and a second protection layer which are sequentially stacked on the semiconductor substrate, the first protection layer comprises a frame defined by a plurality of holes, the concave portions are vertically overlapped with the holes, and the convex portions are vertically overlapped with the frame.

13. The semiconductor package of claim 12, wherein the frame has a width of 1 µm to 2 µm, each of the holes has a diameter of 1 µm to 2 µm, and each of the holes has a depth of 0.25 µm to 2 µm.

14. The semiconductor package of claim 12, wherein:

the protection layers further comprise a third protection layer between the semiconductor substrate and the first protection layer, and the first semiconductor chip further comprises a through-via penetrating the semiconductor substrate and the third protection layer.

15. The semiconductor package of claim 14, wherein the first semiconductor chip further comprises an upper pad connected to the through-via, and the upper pad vertically overlaps the third protection layer and does not overlap the first protection layer.

16. The semiconductor package of claim 14, wherein a surface area of a top surface of the second protection layer is greater than a surface area of an upper surface of the third protection layer.

17. A semiconductor package comprising:

a first semiconductor chip;

a second semiconductor chip stacked on the first semiconductor chip; and an adhesive layer between the first semiconductor chip and the second semiconductor, wherein:

the first semiconductor chip comprises:

a semiconductor substrate;

a through-via penetrating the semiconductor substrate;

a first protection layer and a second protection layer, which are sequentially stacked on the semiconductor substrate; and an upper pad disposed on the second protection layer and connected to the through-via, the first protection layer is provided to define a plurality of holes, and a level of a bottom surface of the second protection layer is lower than a level of a top surface of the first protection layer, in a region overlapped with the holes.

18. The semiconductor package of claim 17, wherein a level of a top surface of the second protection layer is lower than a level of an upper surface of the first protection layer in a region overlapping the holes.

19. The semiconductor package of claim 17, wherein the adhesive layer comprises a non-conductive film.

20. The semiconductor package of claim 17, wherein the first semiconductor chip comprises a logic chip and the second semiconductor chip comprises a memory chip.

* * * * *